United States Patent
Kondo et al.

(10) Patent No.: US 6,803,080 B2
(45) Date of Patent: Oct. 12, 2004

(54) METHOD OF FORMING CRYSTALLINE SILICON FILM BY CVD

(75) Inventors: Takaharu Kondo, Kyoto (JP); Masafumi Sano, Kyoto (JP); Koichi Matsuda, Kyoto (JP); Makoto Higashikawa, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 138 days.

(21) Appl. No.: 10/231,308

(22) Filed: Aug. 30, 2002

(65) Prior Publication Data

US 2003/0021896 A1 Jan. 30, 2003

Related U.S. Application Data

(62) Division of application No. 09/793,574, filed on Feb. 27, 2002, now abandoned.

(30) Foreign Application Priority Data

Feb. 29, 2000 (JP) ........................................ 2000-054982
Feb. 19, 2001 (JP) ........................................ 2001-042459

(51) Int. Cl.$^7$ ................................................. H05H 1/02
(52) U.S. Cl. ........................................ 427/574; 427/578
(58) Field of Search ................................. 427/574, 578

(56) References Cited

U.S. PATENT DOCUMENTS

| 5,571,749 A | 11/1996 | Matsuda et al. ............ 438/484 |
| 5,935,335 A | 8/1999 | Kashiwaya et al. .. 118/723 MR |
| 5,980,999 A | * 11/1999 | Goto et al. .................. 427/572 |
| 5,983,828 A | * 11/1999 | Savas ......................... 438/714 |
| 6,044,792 A | 4/2000 | Ogawa et al. ........... 118/723 E |
| 6,447,850 B1 | * 9/2002 | Ebe et al. ................... 427/573 |

OTHER PUBLICATIONS

J. Meier et al., On the Way Towards High Efficiency Thin Film Silicon Solar Cells by the "Micromorph" Concept, 420 Mat. Res. Soc. Symp. Proc. 3 (1996). no page numbers.

* cited by examiner

Primary Examiner—Bret Chen
(74) Attorney, Agent, or Firm—Fitzpatrick, Cella, Harper & Scinto

(57) ABSTRACT

A film, typically a silicon-based film, is formed on a substrate by means of a plasma CVD process using a high frequency wave in a condition where a resistance element made of a different material than that of the substrate is provided on the electric path between the substrate and the earth. The resultant film shows a high quality and an improved adhesion strength while it can be formed at a practically high rate.

9 Claims, 4 Drawing Sheets

METHOD OF FORMING CRYSTALLINE SILICON FILM BY CVD

CROSS REFERENCE TO RELATED APPLICATIONS

This application is a division of application Ser. No. 09/793,574, filed Feb. 27, 2002 now abandoned.

BACKGROUND OF THE INVENTION

1. Field of the Invention

This invention relates to a film forming method and a film forming apparatus. The present invention also relates to a semiconductor film and a photovoltaic device as well as to a solar cell, a sensor and an image pick-up device using such a photovoltaic device.

2. Related Background Art

Known methods for forming a crystalline silicon-based film include the cast method and other methods with which a film is grown from a liquid phase. However, such methods require the use of a process to be conducted at high temperature and hence is not particularly well adapted to mass production and cost reduction.

In an attempt for dissolving this problem and forming solar cells at low temperature, "ON THE WAY TOWARDS HIGH EFFICIENCY THIN FILM SILICON SOLAR CELLS BY THE 'MICROMORPH' CONCEPT", J. Meier et. al., Mat. Res. Soc. Symp. Proc., Vol. 420, p. 3, 1996 reports that a photoelectric conversion efficiency of 7.7% has been achieved for solar cells of a microcrystalline p-i-n structure formed on a substrate heated to 220° C. by a glow discharge technique using a high frequency wave (110 MHz). There is also a report saying that a photoelectric conversion efficiency of 13.1% has been achieved for solar cells of a multilayer type using amorphous silicon and microcrystalline silicon.

While a microcrystalline silicon film obtained by a glow discharge technique as described in the above identified document operates excellently for photoelectric conversion, the reported film forming rate is far from satisfactory relative to the required film thickness and hence the disclosed method is not industrially feasible particularly in terms of the time necessary for the film forming process.

It is known that, in photovoltaic devices using a crystalline silicon-based film, carriers are generally prevented from moving freely to adversely affect the photoelectric performance of the photovoltaic devices by the influence of dangling bonds of silicon along the boundaries of crystalline silicon grains, the strain appearing on and near the boundaries of crystalline silicon grains, the imperfect crystallinity of silicon and other reasons.

Efforts have been paid to alleviate the above problems particularly in terms of improving the extent of crystallization. Such efforts include a low film forming rate, a heat treatment by irradiation of electron beams or laser beams or by using a lamp, and a film forming process of repeating a silicon film forming step and an annealing step in a hydrogen atmosphere. However, any of such techniques entails a long film forming process time and high cost.

SUMMARY OF THE INVENTION

In view of the above identified circumstances, it is therefore the object of the present invention to provide a silicon-based film and a photovoltaic device that show excellent photoelectric characteristics and can be formed at an industrially feasible rate.

According to the invention, there is provided a method of forming a film on a substrate by means of a plasma CVD process using a high frequency wave, the method comprising forming a resistance element made of a material different from that of the substrate and arranged on the electric path between the substrate and the earth for forming the film.

In another aspect of the invention, there is provided a silicon-based film formed on a substrate by means of a plasma CVD process using a high frequency wave, the silicon-based film being formed in the presence of a resistance element made of a material different from that of the substrate and arranged on the electric path between the substrate and the earth.

In still another aspect of the invention, there is provided a photovoltaic device comprising at least a plurality of silicon-based semiconductor layers of mutually different conduction types formed on a substrate, at least one of the silicon-based semiconductor layers being formed by means of a plasma CVD process using a high frequency wave in the presence of a resistance element made of a material different from that of the substrate and arranged on the electric path between the substrate and the earth.

In still another aspect of the invention, there is provided a film forming apparatus for forming a film on a substrate by means of a plasma CVD process using a high frequency wave, the film forming apparatus comprising a means for varying the insulation between the substrate and the earth.

Preferably, the high frequency wave shows a frequency preferably between 10 MHz and 10 GHz, more preferably between 13.56 MHz and 100 MHz. The source gas may not be decomposed sufficiently if the frequency is lower than 10 MHz. On the other hand, the electron temperature may not rise sufficiently and active species may not be produced satisfactorily if the frequency is higher than 10 GHz.

Preferably, the substrate is an electrically conductive substrate. When the substrate is an electrically conductive substrate, the substrate itself may be exposed and used as electrode.

Preferably, a means for producing a potential difference is provided between the substrate and the earth. Such a potential difference makes it possible to control the type of active species getting to the surface of the formed film.

Preferably, the resistance element is formed by arranging a material showing a volume resistivity not less than $10^{10}$ $\Omega$cm at operating temperature on the electric path between the substrate and the earth. Any ion bombardment can be effectively controlled by selecting a volume resistivity not less than $10^{10}$ $\Omega$cm. Preferably, the upper limit of the volume resistivity is set to $10^{21}$ $\Omega$cm. Any electric current can hardly flow through the substrate to consequently charge the substrate with electricity and disturb the plasma distribution on and near the substrate if the volume resistivity exceeds $10^{21}$ $\Omega$cm.

If the electric current flowing between the substrate and the earth during the generation of plasma is Ig when the substrate is grounded and the electric current flowing between the substrate and the earth during the actual film forming process is If, the film is preferably formed in a condition where the relationship of $|If| \leq 0.01|Ig|$, more preferably the relationship of $|If| \leq 0.001|Ig|$, is established. Any ion bombardment can be effectively controlled when such a relationship is established for $|If|$. For the above described reason, preferably $|If|$ is not equal to 0, more preferably $|If| \geq 0.0001|Ig|$.

While a resistance element is arranged between the substrate and the earth with a method or in a device according to the invention, it should be noted that Ig represents the electric current that flows between the substrate and the earth when plasma is generated under the condition that the resistance element is removed and the substrate and the earth are short-circuited so that no film will be formed under such condition (where an electric current of Ig flows). In other words, Ig represents an imaginary value. However, since it is possible to generate plasma while the substrate is grounded, the value of Ig can be determined with ease in any specific system.

Preferably, the power density of the high frequency wave is between 0.001 and 2 W/cm$^3$ (high frequency wave power/plasma forming volume). Similarly, the pressure is preferably between 0.5 mTorr and 100 Torr.

Preferably, the value of |If| is changed during the film forming process. Particularly, it is preferable to increase the value of |If| during the film forming process.

Preferably, the silicon-based film shows a ratio of the diffraction strength of (220) due to X-ray diffraction or electron beam diffraction to the overall diffraction strength of not less than 30%.

Preferably, the photovoltaic device has at least a pin junction and at least the i-type semiconductor layer of the pin junction comprises a silicon-based film formed by a method according to the invention.

DESCRIPTION OF THE PREFERRED EMBODIMENTS

Figure 1:
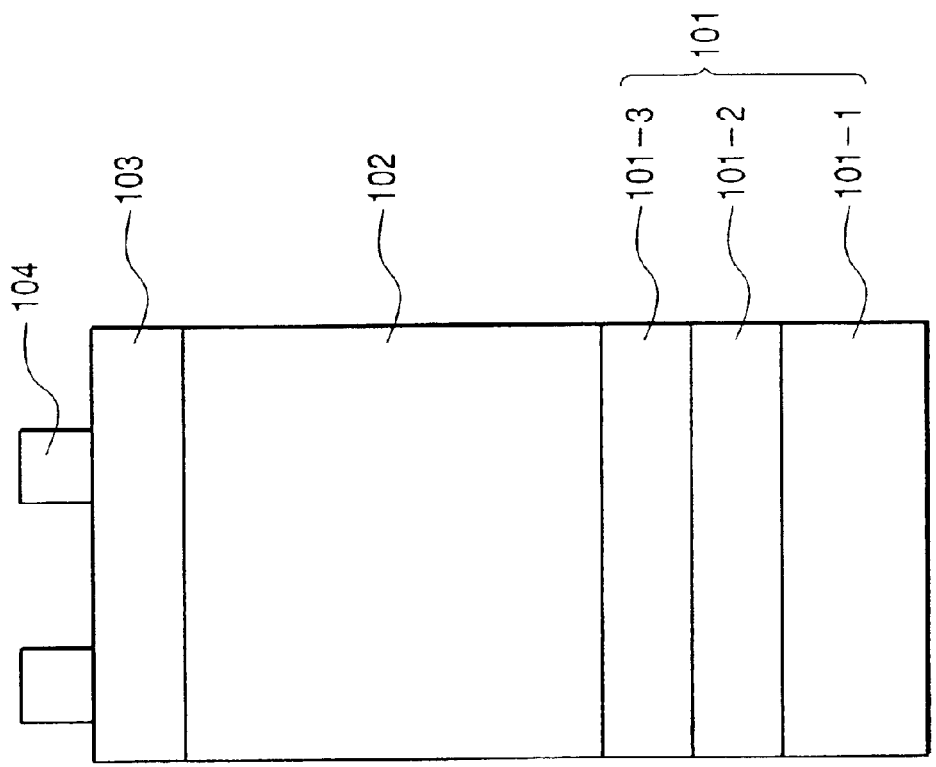
FIG. 1 is a schematic cross sectional view of an embodiment of photovoltaic device according to the invention.

As a result of intensive research efforts paid for dissolving the above identified problems, the inventors of the present invention came to find that a silicon-based film formed on a substrate by means of a plasma CVD process using a high frequency wave at a high film forming rate shows a high film quality and a good adhesiveness if the silicon-based film is formed in the presence of a resistance element made of a material different from that of the substrate and arranged on the electric path between the substrate and the earth because inactivation of grain boundaries is promoted and formation of low density film is suppressed and that a photovoltaic device comprising such a silicon-based film shows excellent photoelectric conversion characteristics and a good environment resistance.

Now, the effects of the present invention will be discussed below.

With a method of forming a silicon-based film containing a crystalline phase on a substrate by means of a plasma CVD process using a high frequency wave, the areas that are brought into contact with plasma including those of the electrodes, the walls of the deposition chamber and the substrate show a negative potential relative to the plasma in the chamber so that the film forming surface of the substrate is subjected to ion bombardment during the plasma generation process.

As the film forming surface of the substrate receives a fierce ion bombardment, activation of grain boundaries is induced by phenomena including the transition of crystalline regions into amorphous regions due to a distorted crystal lattice structure, the reduction of crystallinity that arises as a result of generation of point defects and the generation of dangling bonds due to hydrogen atoms released from grain boundaries to consequently degrade the film quality. These phenomena has remarkably blocked any attempt for improving the film forming rate particularly when the power of the high frequency wave is raised and/or the internal pressure of the deposition chamber is decreased to accelerate the decomposition of the source gas.

The presence of a resistance element as pointed out above can reduce the potential difference between the plasma and the substrate in the deposition chamber to mitigate the fierce ion bombardment. As a result, a silicon-based film can be formed without reducing the crystallinity or activating the grain boundaries. Additionally, it is possible to form a uniform and dense silicon-based film showing a good environment resistance because the produced film is prevented from becoming coarse and therefore firmly adheres to the underlayer.

While the above described effects of the present invention are clear when an electrically conductive substrate is used, the use of an insulating substrate also provides the advantages of the present invention because it can reliably secure the insulation between the substrate and the earth that is otherwise damaged as the film being formed comes to wind around the substrate during the film forming process.

Preferably, the resistance element is formed by arranging a material showing a volume resistivity not less than $10^{10}$ Ωcm at operating temperature on the electric path between the substrate and the earth. Specific examples of materials that can be used for the resistance element include ceramic materials such as $Al_2O_3$, SiC, $Si_3N_4$ and mica, glass materials such as quartz glass, soda glass and Pyrex glass, rubber materials such as chloroprene rubber and silicon rubber and plastic materials such as acrylic resins, epoxy resins, polyvinylchloride, Teflon, nylon, polyethylene and polystyrene as well as composite materials prepared by using any of them.

A specific example of composite materials that can be used for the purpose of the invention is a microcrystalline ceramic substance that can be obtained by deposition using a glass material as matrix. As for the insulation between the substrate and the earth, if the electric current flowing between the substrate and the earth during the generation of plasma is Ig when the substrate is grounded and the electric current flowing between the substrate and the earth during the generation of plasma (for the actual film forming process) according to the invention (using a resistance element) is If, the film is preferably formed in a condition where the relationship of $|If| \leq 0.01|Ig|$ is established.

Still preferably, a means for producing a potential difference is provided between the substrate and the earth. Such a potential difference makes it possible to control the value of |If|. Then, it becomes possible to change the ratio of various active species getting to the surface of the formed film by changing the value of |If|. Thus, it is possible to form a high quality silicon-based film by selectively using various active species depending on the progress of the film forming process. A practical means for producing a potential difference may be the use of a power source adapted to change the voltage and connected in parallel with the resistance element. Alternatively, a constant voltage power source and a variable resistor that are connected in series may be connected in parallel with the resistance element.

With a preferable control method, |If| is held to a low level in the initial stages of the film forming process in order to generate high quality crystalline nuclei and reduce the possible damage to the underlayer and subsequently |If| is raised in order to activate the surface reaction and produce a highly oriented film at a high rate.

Preferably, in the crystalline phase contained in the formed silicon-based film, crystal grains have a diameter between 10 nm and 10 $\mu$m and the dangling bond density is not higher than $10^{17}/cm^3$. Means that can be used for producing a potential difference between the substrate and the earth include the application of a voltage to the substrate by using a DC power source and the utilization of a self-bias effect obtained by applying a DC voltage or a high frequency wave power to the metal material introduced into the deposition chamber.

For a silicon-based film containing a crystalline phase, preferably, crystal grains are arranged not randomly but in the form of a pillar directed along the height of the film since the presence of grain boundaries strongly influences the flow of carriers. Particularly, it is preferable that the (220) plane having a hexagonal channel structure is arranged in parallel with the surface of the substrate. As clear from the ASTM card, in the case of unoriented crystalline silicon, the ratio of the diffraction strength of the (220) plane to the total diffraction strength for the 11 reflections from the low angle side is about 23%. In other words, a silicon-based film whose diffraction strength of the (220) plane exceeds 23% relative to the total diffraction strength is oriented in the direction of the (220) plane. Thus, it may be safe to assume that the mobility of carriers can be highly promoted when the film has a structure where the ratio of the diffraction strength of the (220) plane exceeds 30%.

According to the invention, a silicon-based film is formed by means of a CVD process using a high frequency wave with a frequency between 10 MHz and 10 GHz. A CVD process is adapted to form a silicon-based film at a lower temperature level and hence at a lower cost than a process of forming a silicon-based film from a liquid phase.

A photovoltaic device according to the invention comprises a plurality of silicon-based semiconductor layers of mutually different conduction types formed on a substrate and at least one of the silicon-based semiconductor layers comprises a silicon-based film formed by means of a plasma CVD process using a high frequency wave in a manner as described above. Particularly, a photovoltaic device showing excellent characteristics can be formed by sequentially laying an n-type silicon-based semiconductor layer, an i-type silicon-based semiconductor layer and a p-type silicon-based semiconductor layer, of which the i-type silicon-based semiconductor layer that operates as light absorbing layer comprises a silicon-based film formed by means of a plasma CVD process using a high frequency wave in a manner as described above. The i-type silicon-based semiconductor layer may comprise only the silicon-based film or additionally comprises an amorphous silicon layer laid on the silicon-based film.

A photovoltaic device according to the invention may be formed by sequentially laying two or more than two sets of an n-type silicon-based semiconductor layer, an i-type silicon-based semiconductor layer and a p-type silicon-based semiconductor layer. Since a silicon-based film according to the invention is not or scarcely, if ever, degraded by light, a photovoltaic device that is not or scarcely, if ever, degraded by light can be formed by using a silicon-based film according to the invention as principal light absorbing layer.

Now, the components of a photovoltaic device according to the invention will be described below.

FIG. 1 is a schematic cross sectional view of an embodiment of photovoltaic device according to the invention. Referring to FIG. 1, there are shown a substrate 101, a semiconductor layer 102, a transparent electrode 103 and a collector electrode 104. The substrate 101 comprises a support 101-1, a metal layer 101-2 and a transparent conductive layer 101-3 as components.

While the substrate 101 comprises a support 101-1, a metal layer 101-2 and a transparent conductive layer 101-3 as components in FIG. 1, both the metal layer and the transparent conductive layer or either of them may be omitted. If both of them are omitted, the substrate comprises only a support.

Support

The support 101-1 is preferably a plate-shaped or sheet-shaped member made of metal, resin, glass, ceramic or semiconductor bulk. Its surface may show fine undulations. A transparent support may be used so that light may enter the photovoltaic device from the side of the support. A continuous film forming process can be realized by means of a roll to roll technique if a long support is used. A flexible material such as stainless steel or polyimide can suitably be used for the support.

Metal Layer

The metal layer 101-2 takes the role of an electrode and also that of a reflection layer for reflecting the light getting to the support 101-1 so as to allow the semiconductor layer 102 to reutilize it. Materials that can be used for the metal layer 101-2 include Al, Cu, Ag, Au and CuMg. It can suitably be formed by evaporation, sputtering, electrodeposition or printing. The metal layer 101-2 preferably has undulations on the surface. Then, the light path of reflected light in the semiconductor layer 102 can be elongated to increase the short-circuit current. The metal layer 101-2 may be omitted when the support 101-1 is electrically conductive. Furthermore, the metal layer is preferably omitted when light is made to enter the photovoltaic device from the side of the support.

Transparent Conductive Layer

The transparent conductive layer 101-3 plays the role of increasing both incident light and reflected light and elongate the light path in the semiconductor layer 102. It also plays the role of preventing metal atoms of the metal layer 101-2 from being diffused or migrating into the semiconductor layer 102 to cause the photovoltaic device to shunt. It additionally plays the role of preventing any short-circuit from arising due to the defects of the semiconductor layer such as pin holes particularly when it is made to show an appropriate value of resistance. The electric conductivity of the transparent conductive layer 101-3 is preferably not less than $10^{-8}$ (1/$\Omega$cm) and not more than $10^{-1}$ (1/$\Omega$cm). Like the metal layer 101-2, the transparent conductive layer 101-3 preferably have undulations on the surface. Additionally, the transparent conductive layer 101-3 is made of an electrically conductive oxide such as ZnO or ITO and formed by evaporation, sputtering, CVD or electrodeposition. A substance that modifies the electric conductivity of the conductive oxide may be added to the latter.

Substrate

The substrate 101 is formed by sequentially laying, if necessary, the metal layer 101-2 and the transparent conductive layer 101-3 on the support 101-1. An insulating layer may be arranged as an intermediary layer in the substrate 101 for the purpose of facilitating the integration of devices.

Semiconductor Layer

Silicon (Si) showing an amorphous phase, a crystalline phase or a mixed phase is used as principal material of the silicon-based film, or the semiconductor layer 102 in particular, of a photovoltaic device according to the invention, although an alloy of Si and C or Ge may be used to replace Si. The semiconductor layer 102 additionally contains hydrogen and/or halogen to a preferable concentration between 0.1 and 40 atom %.

The semiconductor layer 102 may additionally contain oxygen and nitrogen. The semiconductor layer may be made to be a p-type semiconductor layer by causing it to contain an element of the III group and to be an n-type semiconductor layer by causing it to contain an element of the V group. In the case of a stack cell (a photovoltaic device having a plurality of pin junctions), it is preferable that the i-type semiconductor layer of the pin junction located close to the side for receiving incident light shows a wide band gap and the band gap is narrowed as remote from that side. It is also preferable that the minimum value of the band gap in the i-type semiconductor layer is found at a position closer to the p-type semiconductor layer from;the middle of the height of the i-type layer. A crystalline semiconductor material showing a low light absorption rate or a wide band gap is suitably used for the doped layer (a p-type layer or an n-type layer) at the side for receiving incident light. In the case of a stack cell formed by sequentially laying two sets of an n-type silicon-based semiconductor layer, an i-type silicon-based semiconductor layer and a p-type silicon-based semiconductor layer, (amorphous silicon and microcrystalline silicon) or (microcrystalline silicon and microcrystalline silicon) may be used in combination respectively for the i-type silicon-based semiconductor layer located close to the side for receiving incident light and the other i-type silicon-based semiconductor layer.

In the case of a stack cell formed by sequentially laying three sets of an n-type silicon-based semiconductor layer, an i-type silicon-based semiconductor layer and a p-type silicon-based semiconductor layer, (amorphous silicon, amorphous silicon and microcrystalline silicon) or (amorphous silicon, microcrystalline silicon and microcrystalline silicon) or (microcrystalline silicon, microcrystalline silicon and microcrystalline silicon) may be used in combination respectively for the i-type silicon-based semiconductor layer located close to the side for receiving incident light, the intermediary i-type silicon-based semiconductor layer and the remotest i-type silicon-based semiconductor layer.

Method of Forming the Semiconductor Layer

A high frequency wave plasma CVD process can suitably be used for forming a silicon-based film and the semiconductor layer 102 thereof, in particular. Now, the steps of a high frequency wave plasma CVD process that can suitably be used for forming a semiconductor layer 102 will be discussed below.

(1) The internal pressure of the deposition chamber (vacuum chamber) adapted to evacuation is reduced to a predetermined deposition pressure level.

(2) The material gas containing the source gas and the dilution gas is introduced into the deposition chamber, while evacuating the inside of the deposition chamber by means of a vacuum pump in order to maintain the internal pressure of the deposition chamber to the predetermined deposition pressure level.

(3) The substrate 101 is heated to a predetermined temperature level by means of a heater.

(4) A high frequency wave oscillated by a high frequency wave power source is introduced into the deposition chamber. Techniques that can be used for introducing a high frequency wave into the deposition chamber include one with which the high frequency wave is led by a waveguide and introduced into the deposition chamber by way of a dielectric window of alumina ceramic or some other appropriate dielectric substance and one with which the high frequency wave is led by a coaxial cable and introduced into the deposition chamber by way of a metal electrode.

(5) Plasma is generated in the deposition chamber to decompose the source gas and form a film deposited on the substrate 101 arranged in the deposition chamber. If necessary, the above steps are repeated several times to form a semiconductor layer 102.

The requirements to be met for forming a silicon-based film, or the semiconductor layer 102 described above in particular, include the substrate temperature of 100 to 450° C. in the deposition chamber, the internal pressure of the deposition chamber of 0.5 mTorr to 100 Torr and the high frequency wave power of 0.001 to 2 W/cm$^3$.

The source gas to be suitably used for forming a silicon-based film, or the semiconductor layer 102 described above in particular, is obtained by using a gasifiable compound containing silicon atoms such as $SiH_4$, $Si_2H_6$ or $SiF_4$. If the semiconductor layer 102 is to be made of an alloy, it is desirable to additionally use a gasifiable compound containing Ge or C such as $GeH_4$ and $CH_4$. Preferably, the source gas is diluted by dilution gas before it is introduced into the deposition chamber. The dilution gas that can be used for the purpose of the present invention may be $H_2$ gas or He gas. A gasifiable compound containing nitrogen and/or oxygen may be added as source gas or dilution gas. $B_2H_6$ or $BF_3$ is typically used as dopant gas for turning the semiconductor layer into a p-type layer. On the other hand, $PH_3$ or $PF_3$ is typically used as dopant gas for turning the semiconductor layer into an n-type layer. When depositing a film of a crystalline phase or a layer typically made of SiC having a property of scarcely absorbing light or having a wide band gap, it is preferable to raise the ratio of the dilution gas to the source gas and introduce a frequency wave having a relatively high power.

Transparent Electrode

The transparent electrode 103 can be made to take the role of an anti-reflection film when it shows an appropriate film thickness.

Materials that can be used for the transparent electrode 103 include ITO (indiumtin oxide), ZnO and $In_2O_3$. Techniques that can be used for forming the transparent electrode 103 include evaporation, CVD, spraying, spin-on and immersion. A substance that can modify the electric conductivity of the material of the transparent electrode 103 may be added thereto.

When light is made to strike the photovoltaic device from the side of the support 101-1, the transparent electrode may be replaced by an opaque electrode. If such is the case, the opaque electrode is preferably made to take the role of an anti-reflection layer. When the photovoltaic device is used for a light transmission type solar cell, a transparent electrode 103 is preferably used even when light is made to strike the photovoltaic device from the side of the substrate.

Collector Electrode

The collector electrode 104 is arranged on the transparent electrode 103 in order to raise the collection efficiency. Techniques that can be used for forming the collector electrode include one adapted to produce the metal of the electrode pattern by sputtering, using a mask, one adapted to print the electrode pattern by means of electrically conductive paste or solder paste and one adapted to rigidly hold metal wires by means of electrically conductive paste.

If necessary, a protection layer may be formed on each of the opposite surfaces of the photovoltaic device. At the same time, a reinforcing member such as a steel plate may be arranged on the rear surface (at the side opposite to the side for receiving light) of the photovoltaic device.

Now, the present invention will be described by way of examples, where solar cells were prepared as photovoltaic devices, although the present invention is by no means limited to those examples.

EXAMPLE 1

A silicon-based film was formed by following the steps described below and using a deposited film forming apparatus 201.

Figure 2:
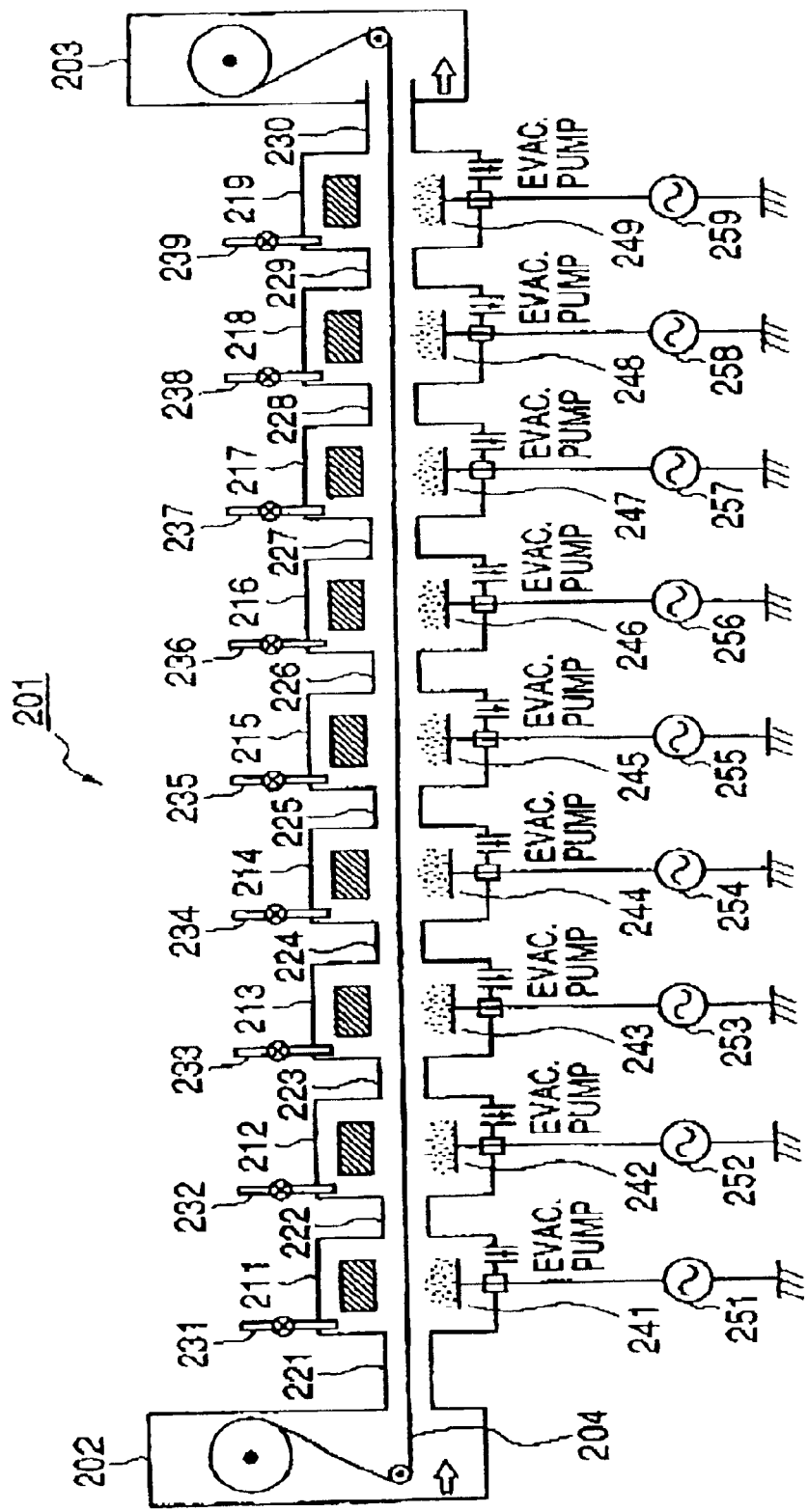
FIG. 2 is a schematic cross sectional view of a deposited film forming apparatus for manufacturing a silicon-based film and a photovoltaic device according to the invention.
Figure 6:
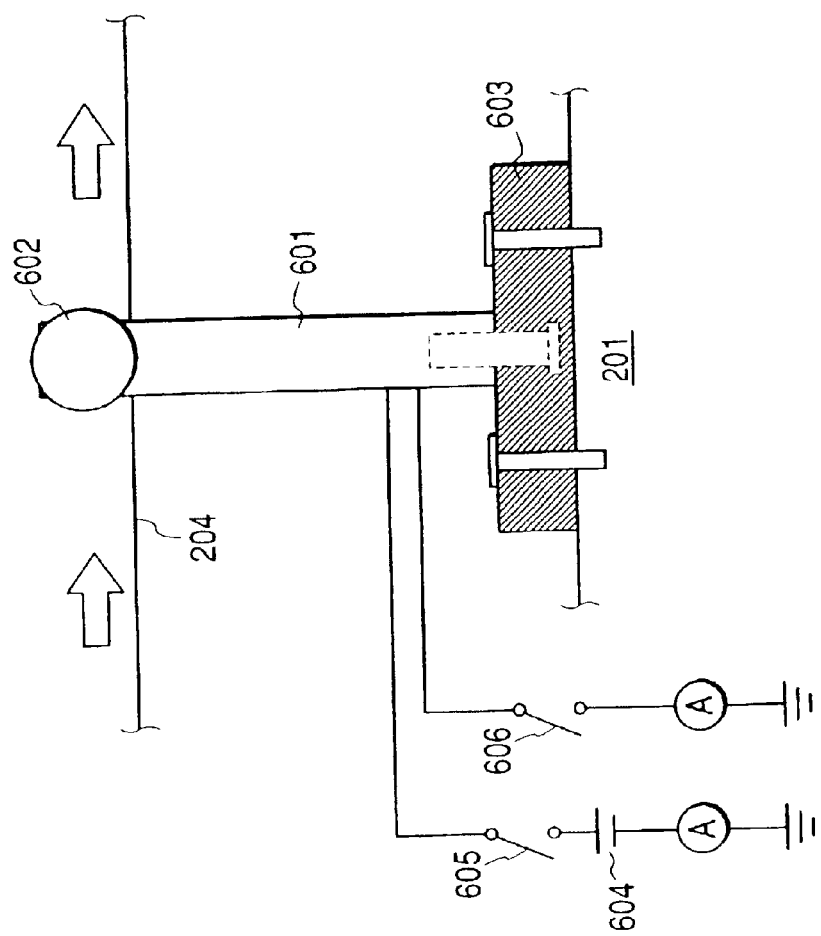
FIG. 6 is a schematic cross sectional view of a magnet roller that can be used in an apparatus according to the invention.
Figure 5:
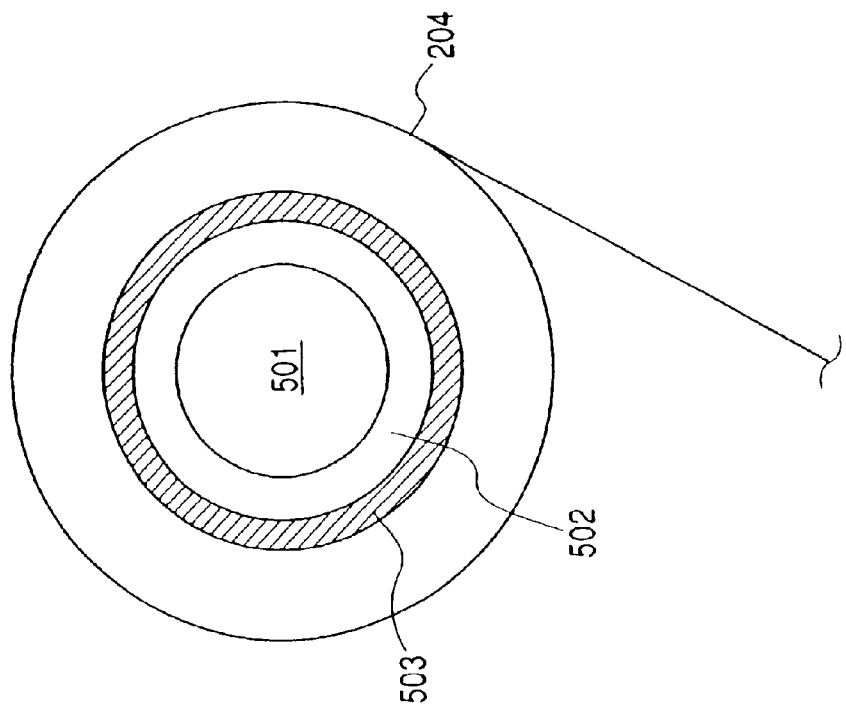
FIG. 5 is a schematic cross sectional view of a bobbin that can used in an apparatus according to the invention.

FIG. 2 is a schematic cross sectional view of a deposited film forming apparatus that can be used for manufacturing a silicon-based film and a photovoltaic device according to the invention (and was actually used in this example). Referring to FIG. 2, the deposited film forming apparatus 201 comprises a substrate feed vessel 202, semiconductor forming vacuum vessels 211 through 219 and a substrate take-up vessel 203 that are linked by way of gas gates 221 through 230. A strip of electrically conductive substrate 204 is arranged in the deposited film forming apparatus 201 in such a way it extends through the vessels and the gas gates. The strip of electrically conductive substrate 204 is fed out of a bobbin arranged in the substrate feed vessel 202 and taken up by another bobbin arranged in the substrate take-up vessel 203. FIG. 5 is a schematic cross sectional view of a bobbin that can be used for the purpose of the invention (and was actually used in this example). Referring to FIG. 5, there are shown a bearing 501, a bobbin core member 502 and a block member 503 made of Teflon. The strip-shaped electrically conductive substrate 204 and the bearing 501 (electrically connected to the deposited film forming apparatus 201) are reliably insulated from each other by the block member 503. A plurality of magnet rollers are arranged along the transfer path of the electrically conductive substrate 204 in order to smoothly move the strip-shaped electrically conductive substrate 204. FIG. 6 is a schematic cross sectional view of one of the magnet rollers used in this example. Referring to FIG. 6, there are shown a roller support section 601, a roller 602, a block member 601 (resistance element) made of mica ceramic, a DC power source 604, a switch 605 to be used for the DC power source and another switch 606 to be used for the earth. The strip-shaped electrically conductive substrate 204 and the deposited film forming apparatus 201 are reliably insulated from each other by the block member 603 when the switches 605 and 606 are opened.

The semiconductor forming vacuum vessels 211 through 219 have respective deposition chambers therein and are adapted to generate a glow discharge by applying a high frequency wave power to respective discharge electrodes 241 through 249 from respective high frequency wave power sources 251 through 259 to thereby decompose the source gas and deposit a semiconductor layer on the electrically conductive substrate 204. Gas feed pipes 231 through 239 are connected to the respective semiconductor forming vacuum vessels 211 through 219 in order to feed the source gas and the dilution gas.

While the deposited film forming apparatus 201 of FIG. 2 is provided with a total of nine semiconductor forming vacuum vessels, it was not necessary to drive all the semiconductor forming vacuum vessels for a glow discharge and the semiconductor forming vacuum vessels were selectively driven for glow discharge according to the layered structure of the photovoltaic device to be prepared in the examples. Additionally, each of the semiconductor forming vacuum vessels is provided with a film forming region regulating plate for regulating the contact area of the electrically conductive substrate 204 and the discharge space in the deposition chamber so that the film thickness of the semiconductor film layer being formed in the vessel can be regulated by using the regulating plate.

Firstly, a strip-shaped support (width: 40 cm, length: 200 m, thickness: 0.125 mm) made of stainless steel (SUS430BA) was thoroughly degreased, washed and then put into a continuous sputtering system (not shown). Then, an Al film was formed thereon by sputtering evaporation to a film thickness of 100 nm, using an Al electrode as target. Thereafter, a ZnO film was formed on the Al film by sputtering evaporation to a film thickness of 1.2 µm, using an ZnO target, to produce a strip-shaped electrically conductive substrate 204.

Subsequently, a bobbin carrying the electrically conductive substrate 204 wound around it is put into the substrate feed vessel 202 and the electrically conductive substrate 204 was made to extend to the substrate take-up vessel 203 by way of the inlet side gas gate 221, the semiconductor forming vacuum vessels 211, 212, 213, 214, 215, 216, 217, 218, 219 and the outlet side gas gate 230. The tension of the extended electrically conductive substrate 204 was regulated to make the latter free from sagging. Then, the substrate feed vessel 202, the semiconductor forming vacuum vessels 211, 212, 213, 214, 215, 216, 217, 218, 219 and the substrate take-up vessel 203 were sufficiently evacuated to a pressure level of lower than $5 \times 10^{-6}$ Torr by means of an evacuation system comprising a vacuum pump (not shown). The switches 605 and 606 were left in the open state.

Thereafter, the source gas and the dilution gas were introduced into the semiconductor forming vacuum vessel 212 by way of the gas feed pipe 232, while operating the evacuation system.

The semiconductor film was formed under the following conditions shown in Table 1.

TABLE 1

| source gas | $SiH_4$: 30 sccm |
| | $H_2$: 1000 sccm |
| substrate temperature | 300° C. |
| pressure | 300 mTorr |

$H_2$ gas was fed at 200 sccm to the semiconductor forming vacuum vessels other than the semiconductor forming vacuum vessel 212 from the respective gas feed pipes and at the same time $H_2$ gas was fed at 500 sccm to the gas gates 221 through 230 from respective gate gas feed pipes (not shown). Under this condition, the evacuation capacity of the evacuation system was regulated to make the inside of the semiconductor forming vacuum vessel 212 show a desired internal pressure level.

When the internal pressure of the semiconductor forming vacuum vessel 212 was stabilized, the electrically conductive substrate 204 was made to move from the substrate feed vessel 202 toward the substrate take-up vessel 203. While moving the electrically conductive substrate 204, an infrared lamp heater (not shown) was turned on to pre-heat the electrically conductive substrate 204 to 300° C.

Thereafter, a high frequency wave was applied to the discharge electrode 242 in the semiconductor forming vacuum vessel 212 from the high frequency power source 252, while the switches 605 and 606 were held open, to generate a glow discharge in the deposition chamber in the semiconductor forming vacuum vessel 212 and form a microcrystalline i-type semiconductor layer (to a film thickness of 1.5 µm) on the electrically conductive substrate 204. The high frequency wave applied to the semiconductor forming vacuum vessel 212 showed a frequency of 100 MHz and a power level of 20 mW/cm$^3$.

Comparative Example 1

The procedure of Example 1 was followed to form a silicon-based film except that the switch 606 was closed and the electrically conductive substrate 204 and the earth were short-circuited. If the electric current flowing between the electrically conductive substrate 204 and the earth in Example 1 was If and the electric current flowing between them in Comparative Example 1 was Ig, they showed a relationship of |If|=1.0×10$^{-3}$ |Ig|. The value of If was reduced from the floating bias of the electrically conductive substrate 204 and the volume resistivity of the block member.

The specimens of silicon-based film obtained in Example 1 and Comparative Example 1 were evaluated for crystallinity by means of an X-ray diffraction method to find that the silicon-based film of Example 1 showed a high diffraction strength and sharp diffraction lines that were by far more excellent than their counterparts of Comparative Example 1. From above, it was found that a silicon-based film according to the invention can advantageously be used for various applications.

EXAMPLE 2

Figure 3:
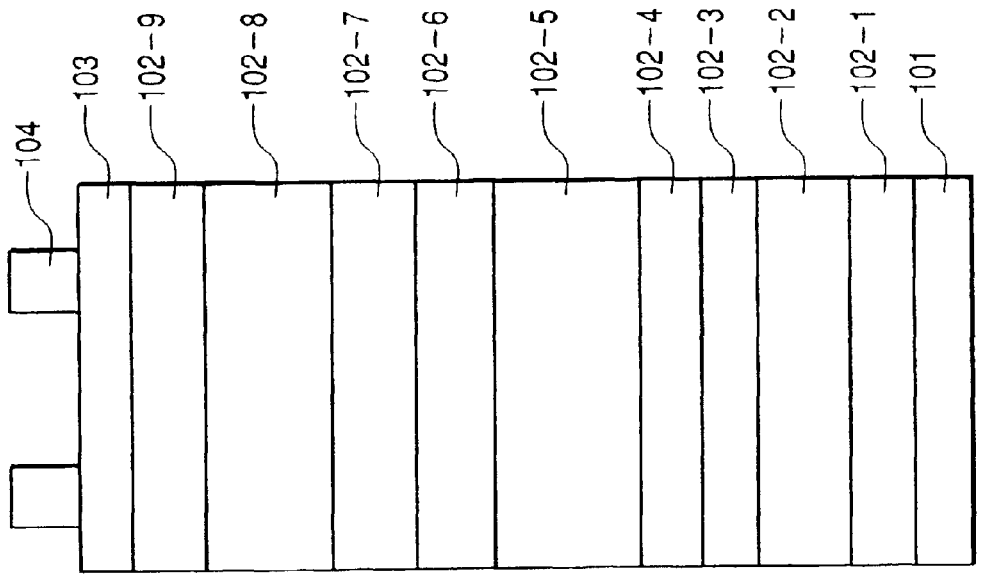
FIG. 3 is a schematic cross sectional view of an embodiment of photovoltaic device according to the invention and comprising a silicon-based film.

A pin type photovoltaic device as shown in FIG. 3 was prepared by using the deposited film forming apparatus 201 of FIG. 2 and following the procedure as described below. FIG. 3 is a schematic cross sectional view of an embodiment of photovoltaic device according to the invention and comprising a silicon-based film. In FIG. 3, the components that are same as or similar to those of FIG. 1 are denoted respectively by the same reference symbols and will not be described any further. The semiconductor layer of this photovoltaic device comprises an amorphous n-type semiconductor layer 102-1, a microcrystalline i-type semiconductor layer 102-2 and a microcrystalline p-type semiconductor layer 102-3. In other words, the photovoltaic device is a so-called pin-type single cell photovoltaic device. A silicon-based film according to the invention is used for the microcrystalline i-type semiconductor layer 102-2.

As in Example 1, a strip-shaped electrically conductive substrate 204 was prepared and put into the deposited film forming apparatus 201 and then the substrate feed vessel 202, the semiconductor forming vacuum vessels 211, 212, 213, 214, 215, 216, 217, 218, 219 and the substrate take-up vessel 203 were sufficiently evacuated to a pressure level of lower than 5×10$^{-6}$ Torr by means of an evacuation system comprising a vacuum pump (not shown). The switches 605 and 606 were left in the open state.

Thereafter, the source gas and the dilution gas for forming amorphous n-type semiconductor were introduced into the semiconductor forming vacuum vessel 211 by way of the gas feed pipe 231 and the source gas and the dilution gas for forming microcrystalline i-type semiconductor were introduced into the semiconductor forming vacuum vessel 212 by way of the gas feed pipe 232, while the source gas and the dilution gas for forming microcrystalline p-type semiconductor were introduced into the semiconductor forming vacuum vessel 213 by way of the gas feed pipe 233 and the evacuation system was made to keep on operating.

The semiconductor film was formed under the following conditions shown in Table 2.

TABLE 2

| n-type semiconductor layer | source gas | $SiH_4$: 20 sccm<br>$H_2$: 100 sccm<br>$PH_3$ (diluted to 2% by $H_2$ gas): 30 sccm |
|---|---|---|
| | substrate temperature | 300° C. |
| | pressure | 1.0 Torr |
| i-type semiconductor layer | source gas | $SiF_4$: 100 sccm<br>$H_2$: 300 sccm |
| | substrate temperature | 300° C. |
| | pressure | 500 mTorr |
| p-type semiconductor layer | source gas | $SiH_4$: 10 sccm<br>$H_2$: 800 sccm<br>$BF_3$ (diluted to 2% by $H_2$ gas): 100 sccm |
| | substrate temperature | 200° C. |
| | pressure | 1.2 Torr |

$H_2$ gas was fed at 200 sccm to the semiconductor forming vacuum vessels 214 through 219 from the respective gas feed pipes 234 through 239 and at the same time $H_2$ gas was fed at 500 sccm to the gas gates 221 through 230 from respective gate gas feed pipes (not shown). Under this condition, the evacuation capacity of the evacuation system was regulated to make the inside of the semiconductor forming vacuum vessels show a desired internal pressure level.

When the internal pressure of the semiconductor forming vacuum vessels was stabilized, the electrically conductive substrate 204 was made to move from the substrate feed vessel 202 toward the substrate take-up vessel 203. While moving the electrically conductive substrate 204, an infrared lamp heater (not shown) was turned on to pre-heat the electrically conductive substrate 204 to 300° C.

Thereafter, a high frequency wave was applied to the discharge electrodes 241, 242, 243 in the respective semiconductor forming vacuum vessels 211, 212, 213 from the respective high frequency power sources 251, 252, 253, while the switch 606 was held open, to generate a glow discharge in the deposition chambers in the respective semiconductor forming vacuum vessels 211, 212, 213 and form an amorphous n-type semiconductor layer 102-1 (to a film thickness of 20 nm) in the semiconductor forming vacuum vessel 211, a microcrystalline i-type semiconductor layer 102-2 (to a film thickness of 1.5 µm in the semiconductor forming vacuum vessel 212 and a microcrystalline p-type semiconductor layer 102-3 (to a film thickness of 10 nm) in the semiconductor forming vacuum vessel 213 on the electrically conductive substrate 204 so that a pin-type photovoltaic device as shown in FIG. 3 was prepared. Then, a high frequency wave with a frequency of 13.56 MHz and a power level of 5 mW/cm³ was applied to the semiconductor forming vacuum vessel 211 and a high frequency wave with a frequency of 100 MHz and a power level of 200 mW/cm³ was applied to the semiconductor forming vacuum vessel 212, while a high frequency wave with a frequency of 13.56 MHz and a power level of 30 mW/cm³ was applied to the semiconductor forming vacuum vessel 213.

Thereafter, the prepared strip-shaped photovoltaic device was cut to produce a solar cell module with dimensions of 36 cm×22 cm by means of a continuous modularizing apparatus (not shown).

Comparative Example 2

The procedure of Example 2 was followed to prepare a solar cell module except that the switch 606 was closed and the electrically conductive substrate 204 and the earth were short-circuited. If the electric current flowing between the electrically conductive substrate 204 and the earth in Example 2 was If and the electric current flowing between them in Comparative Example 2 was Ig, they showed a relationship of $|If|=1.0\times10^{-3} |Ig|$.

Then, the solar cell modules prepared in Example 2 and Comparative Example 2 were tested for the initial photoelectric conversion efficiency by means of a solar simulator (AM1.5, 100 mW/cm²). The adhesion between the electrically conductive substrate and the semiconductor layer was observed by means of a cross-cut adhesion test (with cuts formed at regular intervals of 1 mm and 100 sections). Specimens of solar cell module whose initial photoelectric conversion efficiency had been measured in advance were held in a dark storage area at temperature of 85° C. and relative humidity of 85% for 30 minutes and then the temperature was made to, fall to 20° C. over 70 minutes and held to that temperature for 30 minutes before the temperature and the relative humidity were restored respectively to 85° C. and 85%. The above cycle was repeated 100 times and the photoelectric conversion efficiency was measured again for each of the specimens to see the change in the photoelectric conversion efficiency due to the temperature/humidity test. Other specimens of solar cell module whose initial photoelectric conversion efficiency had been measured in advance were irradiated with pseudo solar rays of AM1.5 and 100 mW/cm² for 50 hours, keeping the temperature to 50° C. and subsequently the photoelectric conversion efficiency was measured again for each of the specimens to see the change in the photoelectric conversion efficiency due to the photo-degradation test.

The obtained results are summarily shown in Table 3 below.

TABLE 3

|  | Example 2 | Comparative Example 2 |
| --- | --- | --- |
| initial photoelectric conversion efficiency | 1 | 0.95 |
| cross-cut adhesion test | no defective section | about 5% defective |
| change in photoelectric conversion efficiency due to temperature/humidity test | 1.0 | 0.95 |
| due to photo-degradation test (effeciency after test/initial efficiency) | 1.0 | 0.95 |

* For the initial photoelectric conversion efficiency, the value of Example 2 was normalized to 1.

As shown in Table 3, the solar cell module of Example 2 that comprises a silicon-based film according to the invention by far excels that of Comparative Example 2 in terms of initial photoelectric conversion efficiency, adhesion and durability to a temperature/humidity test and a photo-degradation test. From above, it was found that a solar cell module comprising a photovoltaic device according to the invention can advantageously be used for various applications.

EXAMPLE 3

Specimens of solar cell module were prepared by following the procedure of Example 2 except that a DC power source 604 as shown in FIG. 6 was used to control the electric current flowing between the electrically conductive substrate 204 and the earth and the value of If was made equal to $|If|=1.0\times10^{-3} |Ig|$ (Example 3-1), $|If|=5\times10^{-3} |Ig|$ (Example 3-2), $|If|=1.0\times10^{-2} |Ig|$ (Example 3-3) and $|If|=5\times10^{-2} |Ig|$ (Example 3-4).

Then, the solar cell modules prepared in Example 3 were tested for the initial photoelectric conversion efficiency by means of a solar simulator (AM1.5, 100 mW/cm²).

The obtained results are summarily shown in Table 4 below.

TABLE 4

|  | photoelectric conversion efficiency |
| --- | --- |
| Example 3-1 | 1 |
| Example 3-2 | 0.99 |
| Example 3-3 | 0.99 |
| Example 3-4 | 0.88 |

* For the initial photoelectric conversion efficiency, the value of Example 3-1 was normalized to 1.

As shown in Table 4, the solar cell modules of Examples 3-1 through 3-3 that comprise a silicon-based film according to the invention by far excel that of Example 3-4 in terms of initial photoelectric conversion efficiency. From above, it was found that a solar cell module comprising a photovoltaic device according to the invention provides an excellent photoelectric conversion efficiency when a relationship of $|If| \leq 1.0\times10^{-2} |Ig|$ holds true.

EXAMPLE 4

A solar cell module was prepared by following the procedure of Example 2 except that a DC power source 604 as shown in FIG. 6 was used to control the electric current flowing between the electrically conductive substrate 204 and the earth and the value of If was raised from the initial stage to the final stage of film formation. More specifically, If was $|If|=1.0\times10^{-3} |Ig|$ in the initial stage of film formation and $|If|=5\times10^{-3} |Ig|$ in the final stage of film formation.

Then, the prepared solar cell module was tested for the initial photoelectric conversion efficiency by means of a solar simulator (AM1.5, 100 mW/cm²). The solar cell module of Example 4 showed a photoelectric conversion efficiency that is 1.1 times higher than that of the solar cell module of Example 2. A part of the solar cell module of Example 4 was cut and measured for diffraction strength by means of an X-ray diffractometer to find that the ratio of the diffraction strength of the (220) plane to the total diffraction strength of X-rays of the solar cell module of Example 4 was about 1.2 times of the corresponding value of Example 2. From above, it was found that the orientation of the (200) plane is increased to improve the advantages of the present invention by raising the value of If from the initial stage to the final stage of film formation.

EXAMPLE 5

Figure 4:
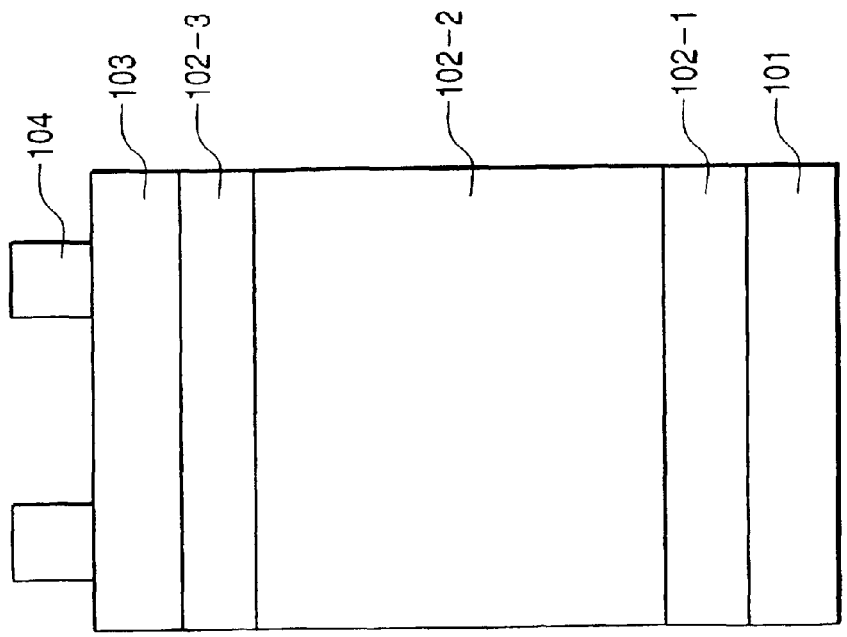
FIG. 4 is a schematic cross sectional view of another embodiment of photovoltaic device according to the invention and comprising a silicon-based film.

A triple type photovoltaic device of pin/pin/pin as shown in FIG. 4 was prepared in this example by using the deposited film forming apparatus 201 of FIG. 2.

FIG. 4 is a schematic cross sectional view of another embodiment of photovoltaic device according to the invention and comprising a silicon-based film. The components of the embodiment of FIG. 4 that are similar to or same as those of the embodiment of FIG. 1 or FIG. 3 are denoted respectively by the same reference symbols and will not be described any further. The semiconductor layer of the photovoltaic device is realized by laying a pin junction comprising an amorphous n-type semiconductor layer 102-4, a microcrystalline i-type semiconductor layer 102-5 and a microcrystalline p-type semiconductor layer 102-6 and then another pin junction comprising an amorphous n-type semiconductor layer 102-7, an amorphous i-type semiconductor layer 102-8 and a microcrystalline p-type semiconductor layer 102-9 on the pin junction of FIG. 3. The bottom cell of the triple type photovoltaic device (the pin junction arranged on the substrate) was prepared under the conditions of Example 2 and the middle cell (the second pin junction arranged on the substrate) was prepared by forming the amorphous n-type semiconductor layer 102-4, the microcrystalline i-type semiconductor layer 102-5 and the microcrystalline p-type semiconductor layer 102-6 respectively in the semiconductor forming vessels 214, 215 and 216, whereas the top cell (the pin junction of the incident light receiving side) was prepared by forming the amorphous n-type semiconductor layer 102-7, the amorphous i-type semiconductor layer 102-8 and the microcrystalline p-type semiconductor layer 102-9 respectively in the semiconductor forming vessels 217, 218 and 219.

The same conditions for forming an n-type semiconductor layer, an i-type semiconductor layer and a p-type semiconductor layer as shown in Table 2 were used for the middle cell and for the amorphous n-type semiconductor layer 102-7 and the microcrystalline p-type semiconductor layer 102-9 of the top cell. The amorphous i-type semiconductor layer 102-8 was formed under the conditions of source gas $SiH_4$: 50 sccm, $H_2$: 500 sccm, substrate temperature: 220° C. and pressure: 1.2 Torr. The film thickness of the i-type semiconductor layer of the middle cell and that of the i-type semiconductor layer of the top cell were regulated in such a way that the electric current may flow in a well balanced manner in each of the cells. The value of If and that of Ig were made to show the relationship of $|If|=1.0\times10^{-3} |Ig|$.

Thereafter, the prepared strip-shaped photovoltaic device was cut to produce a solar cell module with dimensions of 36 cm×22 cm by means of a continuous modularizing apparatus (not shown). Then, the prepared solar cell module was tested for the initial photoelectric conversion efficiency by means of a solar simulator (AM1.5, 100 mW/cm$^2$). The solar cell module of Example 5 showed a photoelectric conversion efficiency that is 1.5 times higher than that of the solar cell module of Example 2.

From above, it was found that the photoelectric conversion efficiency of a solar cell module comprising a photovoltaic device according to the invention can be further improved by using an appropriate multilayer structure for it.

As described above, a silicon-based film formed by a film forming method according to the invention shows a high film quality and a good adhesiveness even if the film is formed at a high film-forming rate because inactivation of grain boundaries is promoted and formation of low density film is suppressed. Additionally, a photovoltaic device according to the invention shows excellent photoelectric conversion characteristics and a good environment resistance if the photovoltaic device is formed by sequentially laying a plurality of silicon-based semiconductor layers of different conduction types on a substrate and at least one of the silicon-based semiconductor layers (an i-type semiconductor layer in particular) of said plurality of silicon-based semiconductor layer is made to comprise a silicon-based film according to the invention.

Finally, a solar cell realized by using a photovoltaic device according to the invention provides advantages including a high power generating capacity and a good environment resistance while a sensor realized by using a photovoltaic device according to the invention provide advantages including a high S/N ratio and a good environment resistance and an image pick-up device according to the invention is highly sensitive and shows a good environment resistance.

What is claimed is:

1. A method of forming a crystalline silicon film on a substrate comprising:

forming a crystalline silicon film on a substrate by chemical vapor deposition at a high frequency while employing a resistance element comprised of a material different from the material of the substrate provided on an electric path between the substrate and ground, wherein an electric current flowing between the substrate and ground during generation of a chemical vapor deposition plasma with the substrate being grounded is defined as Ig and wherein an electric current flowing between the substrate and ground during said film forming is defined as If, and wherein the crystalline silicon film is formed such that $|If|\leq 0.01 |Ig|$.

2. The film forming method according to claim 1, wherein the substrate is electrically conductive.

3. The film forming method according to claim 1, where a volume resistivity of the resistance element during the film formation is not less than $10^{10}$ Ωcm.

4. The film forming method according to claim 1, including varying the value of the |If| during the forming of the film.

5. The film forming method according to claim 4, including increasing the value of the |If| during the forming of the film.

6. The film forming method according to claim 1, wherein an electric potential difference is provided between the substrate and the ground.

7. The film forming method according to claim 1, wherein the high frequency is between 10 MHz and 10 GHz.

8. The film forming method according to claim 1, wherein the high frequency has a power density between 0.001 W/cm$^3$ and 2 W/cm$^3$.

9. The film forming method according to claim 1, wherein the film is formed at a pressure between 0.5 mTorr and 100 Torr.

* * * * *

UNITED STATES PATENT AND TRADEMARK OFFICE
CERTIFICATE OF CORRECTION

PATENT NO. : 6,803,080 B2  Page 1 of 1
DATED : October 12, 2004
INVENTOR(S) : Takaharu Kondo et al.

It is certified that error appears in the above-identified patent and that said Letters Patent is hereby corrected as shown below:

Column 1,
Line 7, "February 27, 2002" should read -- February 27, 2001 --.

Signed and Sealed this

Twenty-seventh Day of June, 2006

JON W. DUDAS
*Director of the United States Patent and Trademark Office*